United States Patent
Nikitin et al.

(10) Patent No.: US 7,103,868 B2
(45) Date of Patent: Sep. 5, 2006

(54) OPTIMIZING DEPTHS OF CIRCUITS FOR BOOLEAN FUNCTIONS

(75) Inventors: Andrey A. Nikitin, Moscow (RU); Alexander E. Andreev, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 752 days.

(21) Appl. No.: 10/291,982

(22) Filed: Nov. 12, 2002

(65) Prior Publication Data

US 2004/0093578 A1 May 13, 2004

(51) Int. Cl.
*G06F 17/50* (2006.01)

(52) U.S. Cl. .................. 716/17; 716/1; 716/2
(58) Field of Classification Search ............ 716/1, 716/2, 17
See application file for complete search history.

(56) References Cited

U.S. PATENT DOCUMENTS

| | | | |
|---|---|---|---|
| 4,998,219 A | 3/1991 | Frauenglass | |
| 5,721,809 A | 2/1998 | Park | |
| 6,124,736 A * | 9/2000 | Yamashita et al. | 326/113 |
| 6,505,322 B1 * | 1/2003 | Yamashita et al. | 716/1 |
| 6,931,424 B1 | 8/2005 | Joseph | |
| 2003/0084411 A1 * | 5/2003 | Moskewicz et al. | 716/3 |
| 2004/0060019 A1 * | 3/2004 | Secatch et al. | 716/6 |

OTHER PUBLICATIONS

Chaudhary, Kamal et al., "A Near Optimal Algorithm for Technology Mapping Minimizing Area under Delay Contraints", Proceedings, 29th ACE/IEEE Design Automation Conference, 1992, pp. 492-498*

Chaudhary, Kamal et al., "Computing the Area vesus Delay Trade-Off Curves in Technology Mapping", IEEE Trans. on Computer-Aided Design of Integrated Circuits and Systems, vol. 14, No. 12, Dec. 1995, pp. 1480-1488.*

Timing-Driven Logic Bi-Decomposition, Jun. 2003, IEEE Transactions on Computer-Aided Design of Integrated Circuits, vol. 22, iss. 6, pp. 675-685—Author(s)—Cortadella.

* cited by examiner

*Primary Examiner*—Jack Chiang
*Assistant Examiner*—Magid Y. Dimyan
(74) *Attorney, Agent, or Firm*—Westman, Champlin & Kelly (57) ABSTRACT

Boolean circuits are designed with minimal depth by calculating the depth of an existing circuit. Those subtrees having a non-regular root cell (i.e., cells having other than one child or having a child of a type different from the cell) are balanced by constructing a new subtree. The cells are then iteratively transformed with parent and/or grandparent cells to reduce the depth of the circuit. The transformation may include balancing the subtree to make the parent cell the same type as the selected cell, or by creating a new cell as parent to the selected cell.

23 Claims, 5 Drawing Sheets

OPTIMIZING DEPTHS OF CIRCUITS FOR BOOLEAN FUNCTIONS

FIELD OF THE INVENTION

This invention relates to integrated circuits, and particularly to minimizing depth of Boolean integrated circuits.

BACKGROUND OF THE INVENTION

One important problem in integrated circuit (IC) design is the minimization of the delay in the circuits. In ICs, Boolean circuits comprise trees to carry out certain Boolean functions. Typically, the Boolean circuits are created from a library of Boolean elements such as two-input AND and OR elements (cells) and NOT (inverter) elements or cells. The delay of Boolean circuits can ordinarily be minimized by minimizing the depth of the Boolean circuit.

The maximal number of cells that lie on any path from any input of a Boolean circuit to the output of the Boolean circuit is called a depth of a Boolean circuit. Each cell along the path adds one to the depth of the circuit. Thus, a tree or subtree having a path containing eight cells has a depth of 8. The delay of a Boolean circuit increases with its depth.

Considerable attention has been given to minimizing depth of Boolean circuits. Much of the attention has been directed at certain classes of Boolean functions (such as comparators, adders, subtractors, multipliers, etc), and to the development of techniques that allow fabricating Boolean circuits with small depth and small number of cells. In the present case, consideration is given to the special classes of Boolean circuits that perform the following functions:

$$f_0(x_1, x_2, \ldots, x_n) = x_1 \vee (x_2 \wedge (x_3 \wedge (x_4 \vee (\ldots))))$$

$$f_1(x_1, x_2, \ldots, x_n) = x_1 \wedge (x_2 \vee (x_3 \wedge (x_4 \vee (\ldots)))).$$

The above functions are important because they are included in many arithmetic operations, such as addition, subtraction, and comparison. A fast hardware evaluation of these functions has been developed based on the presumption that all inputs $x_1, x_2, \ldots, x_n$ of functions $f_0$ and $f_1$ have the same arrival depth when functions $f_0$ and $f_1$ are a part of adders and comparators.

Functions $f_0$ and $f_1$ are used in several methods of synthesis Boolean circuits other than special arithmetical operations, for example a Boolean function y determined by the RTL-Verilog code:

y=0;
if (A1) y=1;
if (A2) y=0;
if (A3) y=1;
if (A4) y=0;
if (A5) y=1;
...
if (An) y=0.

It is clear that $y=f_1(A_1, A_{n-1}, \ldots, A_1)$. Consequently, functions $f_0$ and $f_1$ can be used during the synthesis of Boolean circuits to evaluate Boolean functions determined by some programming languages.

Variables $A_1, A_2, \ldots, A_n$ can be either single variables or comprehensive expressions that are evaluated by different Boolean circuits. These variables often have the different arrival depths. Because the values of variables $A_1, A_2, \ldots, A_n$ are evaluated by the different Boolean circuits whose depths are optimized separate from each other, a need exists for a more universal method of rapid reduction of the depth of functions $f_0$ and $f_1$ for various sets of arrival depths of inputs $A_1, A_2, \ldots, A_n$.

SUMMARY OF THE INVENTION

The present invention is directed to a process of fabricating Boolean circuits of minimal depth functions having different input arrival depths.

In one embodiment, Boolean circuits are designed with minimal depth. The depth of an existing circuit is calculated, the Boolean circuit being composed of cells arranged in a tree to perform a Boolean function. Those subtrees having a non-regular root cell is balanced, wherein a non-regular cell is one having a number of children other than one or having one child of a type different from the root cell. The cells are iteratively transformed parent and/or grandparent cells until the depth of the circuit not reduced between two successive iterations. The resulting circuit design is then output.

The subtrees are balanced by constructing a new subtree connected to the nets that are leaves to the tree, or by creating a new cell connected to two leaves that are nets with minimal depth and thereupon constructing a new subtree connected to the leaves.

If a parent cell to a selected cell has two or more children or is a type different from that of the selected cell, the subtree may be adjusted so that the parent cell is the same type as its child and has more than one child. Adjustment of the subtree can be accomplished by balancing the subtree to make the parent cell the same type as the selected cell (if the parent and selected cells were of different types), or by creating a new cell as parent to the selected cell (if the parent cell had more than one child cell).

The adjustment of the subtree by creating a new parent cell can be accomplished by creating a new cell as a duplicate of the parent cell, and connecting the selected cell to the new parent cell. The adjustment of the subtree by balancing the subtree can be accomplished by creating new parent cells of the same type as the selected cell, and a selected new cell of the same type as the original parent cell. Each new parent cell is connected to the other parent cell and to a respective grandparent cell of the original parent cell. The selected new cell is connected to new parent cells. The subtrees containing the new parent cells are then balanced.

In another embodiment of the present invention, a computer readable code is provided to cause a computer to perform the processes of the invention.

DETAILED DESCRIPTION OF THE PREFERRED EMBODIMENTS

In the present invention, inputs $x_1, x_2, \ldots, x_n$ have respective arrival depths expressed as non-negative integer numbers $d_1, d_2, \ldots, d_n$. This is different from the case where $d_1 = d_2 = \ldots = d_n = 0$.

Figure 1:
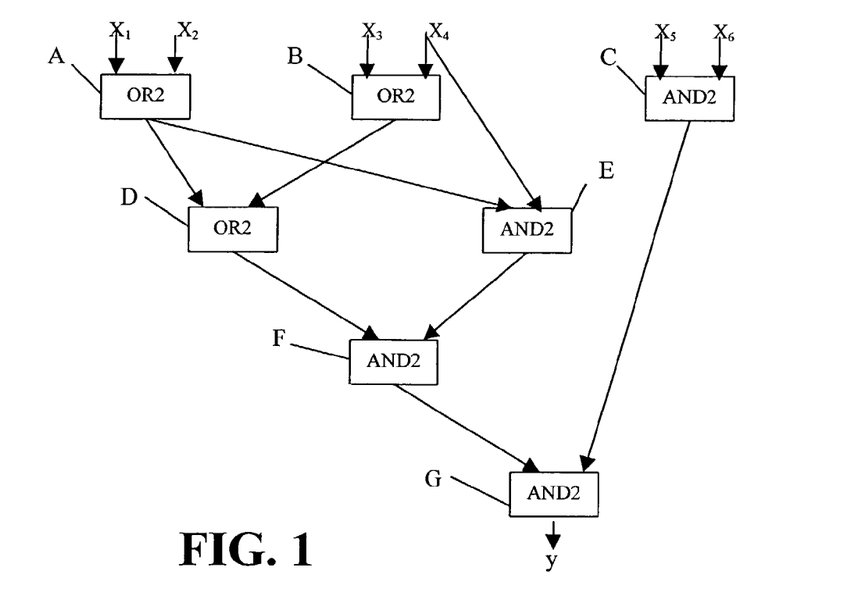
FIGS. 1 and 2 are diagrams of Boolean circuits useful in explaining certain of the expressions used herein.

FIG. 1 illustrates a Boolean circuit with inputs $x_1, x_2, \ldots, x_6$ and output y. There are 3 two-input cells of the type OR2:

A, B, D, and 4 two-input cells of type AND2: C, E, F, G. For ease of explanation, the names of the nets are the same as the names of their respective driver cells, so net A is connected to the output of cell A; net B is connected to the output of cell B, etc.

A cell U is connected to a cell V (or input $x_i$) if one of inputs of cell U is connected to the net that is driven by the cell V (or input $x_i$). In such case, cell U is a child of cell V (or input $x_i$), and cell V (or input $x_i$) is a parent of cell U. In the example of FIG. 1, cell A is connected to inputs $X_1$ and $X_2$ and cell F is connected to cells D and E. Thus, cell F is a child of cells D and E and cells D are E are parents to cell F.

$P_0(U)$ and $P_1(U)$ are the parents of the cell U. The depth d is recursively defined for each cell and each net of the Boolean circuit. For each input $x_i$ assume $d(x_i)=d_i$. The depth d(U) for each cell U and the net U connected to the output of cell U is defined as 1 plus the maximum depth of the parent with the largest depth. Hence, depth d(U) can be written as $d(U)=\max(d(P_0(U)),d(P_1(U)))+1$. In the example, $d(A)=\max(d(x_0),d(x_i))+1$, and $d(F)=\max(d(D),d(E))+1$.

Using this recursive definition, the depth of all the cells can be calculated. If $d_1=d_2=\ldots d_6=0$, $d(A)=d(B)=d(C)=1$ $d(D)=d(E)=2$ $d(F)=3$ $d(G)=4$ Hence, the depth of the Boolean circuit is the depth of the net to which its output connected. Thus, the depth of the Boolean circuit shown in FIG. 1 is d(G)=4.

Cells are ordered in "topological order" if they are ordered by depth in ascending order; cells are ordered in "back topological order" if they are ordered by depth in descending order. In the example the order A, B, C, D, E, F, G is a topological order.

A cell U is called "dis-balanced" if $d(P_0(U))\neq d(P_1)(U))$. In the example there are two dis-balanced cells: E and G.

A cell U is a called a "regular" cell if it has only one child and this child is of the same type (AND2 or OR2) as the type of the cell U. In the example there are four regular cells: B, C, E and F. A "non-regular cell" is one having a number of children other than one, or a single child of a different type. Thus, cell A is a non-regular cell because it has two children, cell D is a non-regular cell because its child is a different type from cell D, and cell G is a non-regular cell because it has no children.

For each non-regular cell U a uniform subtree D(U) fragment of the Boolean circuit is determined recursively:
1) U∈D(U);
2) if the cell V∈D(U) and cell $P_i(V)$, i=0, 1, is a regular cell, it implies that $P_i(V)$∈D(U);
3) the uniform subtree D(U) also contains all nets connected to any input of any cell V∈D(U).

Figure 2:
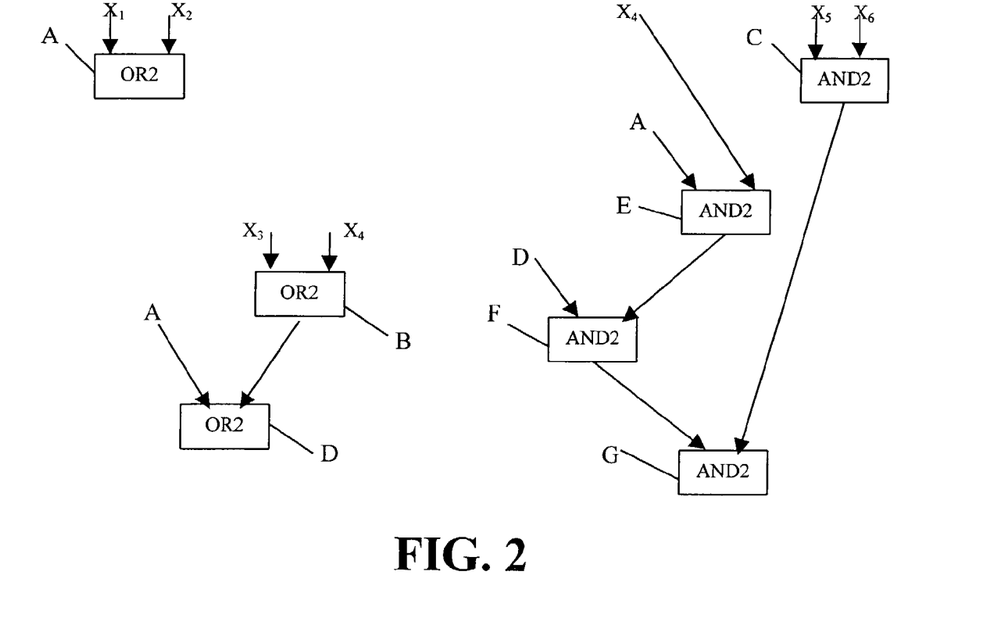

FIG. 2 illustrates the uniform subtrees D(A), D(D) and D(G) of the three non-regular cells shown in FIG. 1. The non-regular cell U is the root of the uniform subtree D(U). Each Boolean circuit consisting of OR2 and AND2 cells can be presented as the union of uniform subtrees created for all non-regular cells. Thus each cell V of the Boolean circuit belongs to one of its uniform subtrees, and the root of the uniform subtree that contains cell V is cell R(V).

Finally, two cells U and V are considered duplicates if they are connected to the same cells and they are of the same type.

Figure 3:
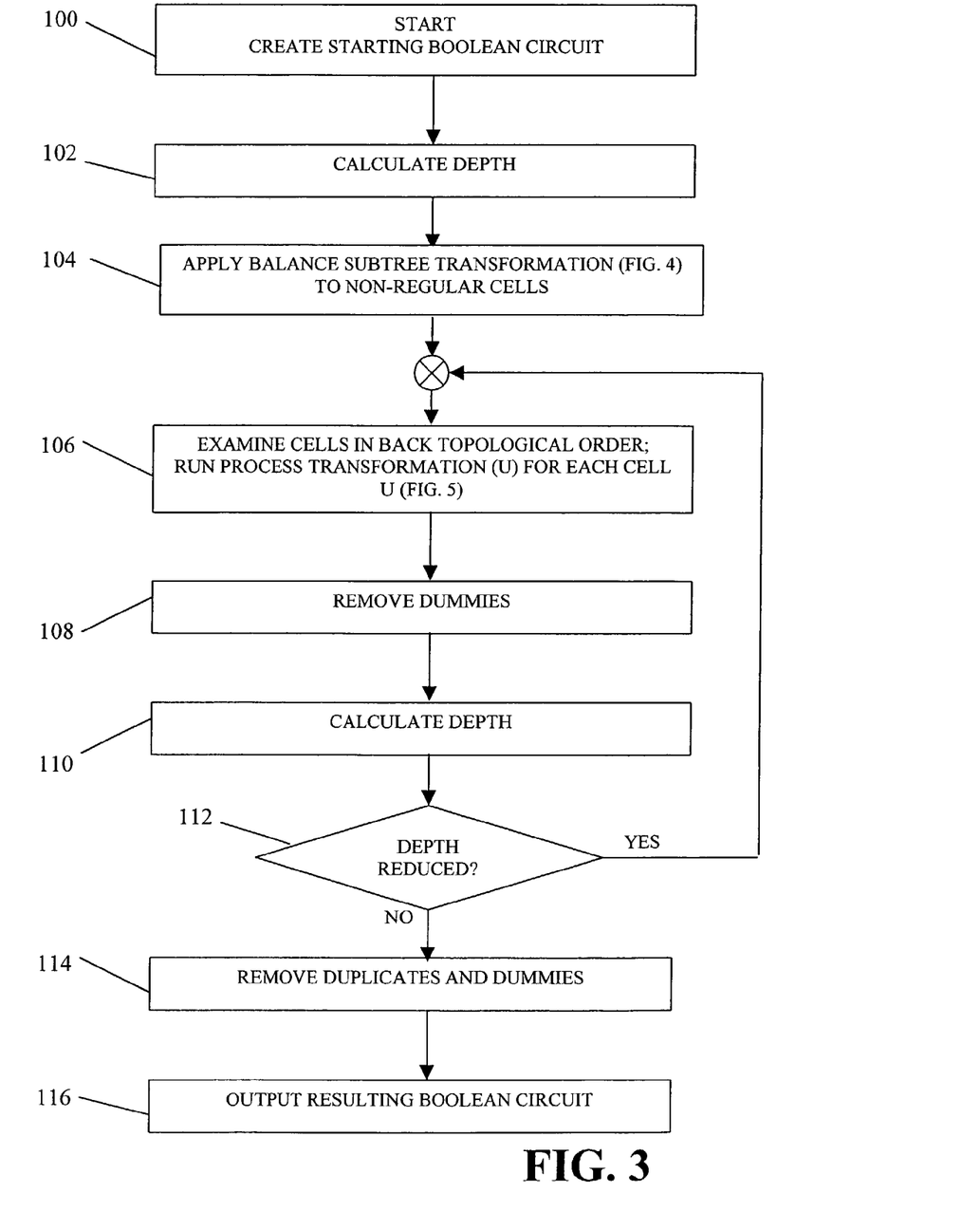
FIG. 3 is a flowchart of the steps of the process of optimizing depth of Boolean circuits in accordance with a preferred embodiment of the present invention.

FIG. 3 is a flowchart of the process of the present invention. The process begins at step 100 with the Boolean circuit determined by the expression $x_1 \vee (x_2 \wedge (x_3 \vee (x_4 \wedge ( \ldots ))))$ for function $f_0(x_1, x_2, \ldots, x_n)$ and by the expression $x_1 \wedge (x_2 \vee (x_3 \wedge (x_4 \vee ( \ldots ))))$ for function $F_1(x_1, x_2, \ldots, x_n)$. The Boolean circuit description, such as in Verilog code, is input to the process at step 100. In accordance with the invention equivalent transformations will be applied to the starting Boolean circuit to reduce the depth of the resulting circuit. Because only equivalent transformations are employed, the evaluation of the Boolean function $F_k(x_1, x_2, \ldots, x_n)$, where k=0, 1, by the resulting Boolean circuit is the same as the evaluation of the function by the starting Boolean circuit.

At step 102, the CALCULATE DEPTH procedure is run. The CALCULATE DEPTH procedure examines all the cells in the topological order. The depth of each regular cell is calculated as the maximum of the depth of parents plus one. A BALANCE SUBTREE transformation is applied to non-regular cells U at step 104. The BALANCE SUBTREE transformation is described in detail in connection with FIG. 4.

At step 106, the cells are examined in back topological order. The PROCESS TRANSFORMATION procedure is applied to each cell U. The PROCESS TRANSFORMATION procedure is described in greater detail in connection with FIG. 5.

At step 108, the REMOVE DUMMY procedure is applied. Dummy cells may have existed in the starting Boolean circuit, or created as part of one or both of steps 104 or 106. To remove dummy cells, all cells are examined in the topological order. If both parents of the cell are the same the cell is removed, and all the children of this cell are reconnected to the parent cells.

At step 110, the CALCULATE DEPTH procedure, described in step 102, is re-run. If the depth of the circuit was reduced during steps 106–110, the process loops back to step 106 at step 112. Otherwise, the process continues to step 114 where a REMOVE DUPLICATES AND DUMMY procedure is run. In this procedure, all cells are examined in the topological order. If the cell has a duplicate cell, the cell is removed and all the children of the cell are reconnected to the duplicate. If both parents of the cell are the same, the cell is removed and all children of the cell are reconnected to the parent cells.

Finally, the process ends at step 116 with the output of the resulting Boolean circuit.

Figure 4:
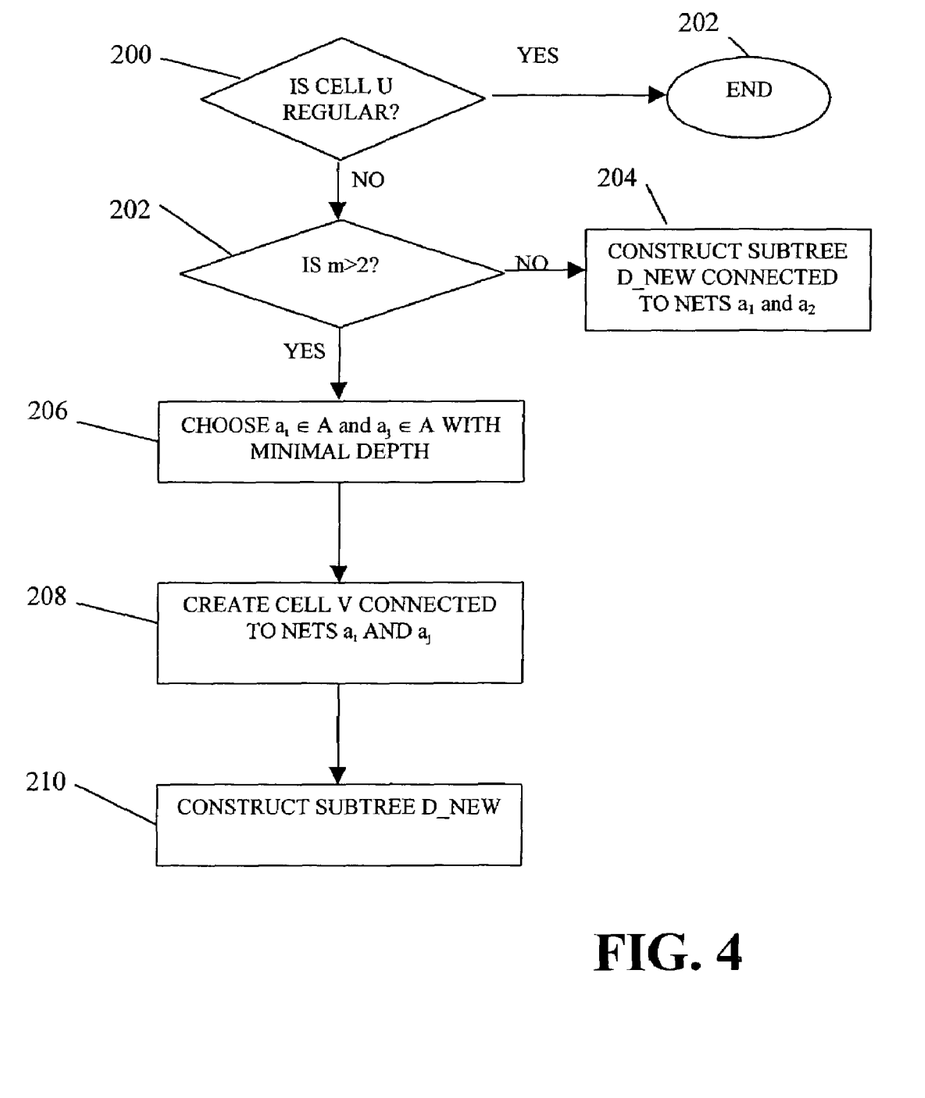
FIGS. 4–7 are flowcharts of certain subprocesses used in the process illustrated in FIG. 3.
Figure 6:
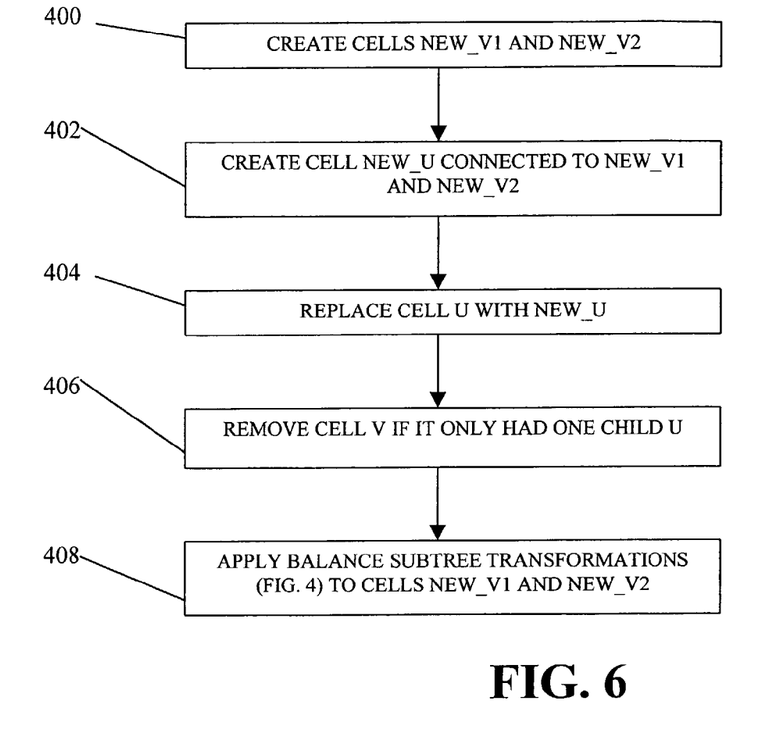
Figure 7:
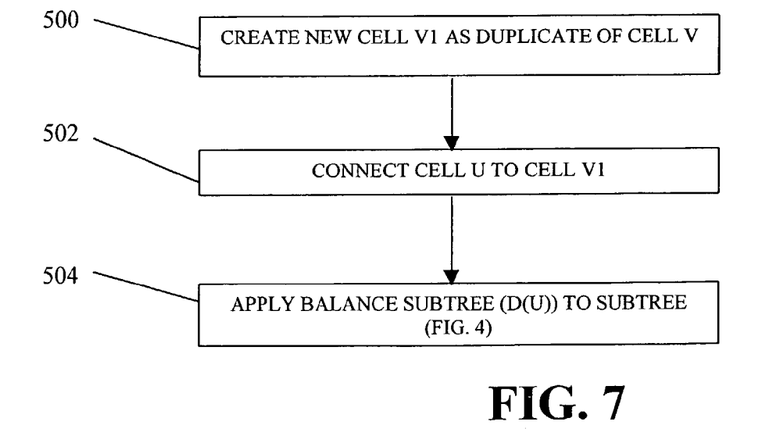

FIG. 4 is a flowchart of the BALANCE SUBTREE transformation used at steps 104 (FIG. 3), 408 (FIG. 6) and 504 (FIG. 7). If at step 200 the cell U of the Boolean circuit is a regular cell, no action is necessary and the transformation ends. If, at step 200, cell U is a non-regular cell the uniform subtree D=D(U) is used to construct a new uniform subtree D_NEW and replace the uniform subtree D with the new subtree D_NEW so that the children of the cell U become connected to the root cell of the subtree D_NEW. Both subtrees D and D_NEW have the same number of cells but the depth of the root cell of the subtree D_NEW can be less than the depth of the cell U.

The process of constructing the subtree D_NEW starts as step 202. Let A=$(a_1, a_2, \ldots, a_6)$, where m≧2, be a set of nets that are the leaves of the subtree D and let $s_1, s_2, \ldots, s_m$ be the depths of these nets. For example, the uniform subtree D(D) shown in FIG. 2 has 3 leaves: A, $X_3$, $X_4$ with depths 1, 0, 0 respectively. Subtree D_NEW is defined recursively.

At step 202, a determination is made as to whether m=2 or m>2 (recall, m is the number of nets that are leaves to the subtree). If at step 202 m=2, subtree D_NEW is established at step 204 and consists of one cell connected to nets $a_1$ and $a_2$. The type of this cell is the same as cell U.

If at step 202 m>2, the process continues to step 206 to chose leaves $a_1 \epsilon A$ and $a_j \epsilon A$ with minimal possible depths $s_1$ and $s_j$. At step 208, cell V is created connected to nets $a_1$ and $a_2$ with the same type as cell U. Net V is connected to the output of the cell V and $s=\max(s_1,s_j)+1$ is the depth of the cell V. Subtree D_NEW is constructed at step 210 for the set of leaves $\{V, a_1, a_2, \ldots, a_m\}\backslash\{a_1, a_j\}$. This set has one less net than the set $A=\{a_1, a_2, \ldots, a_m\}$.

Figure 5:
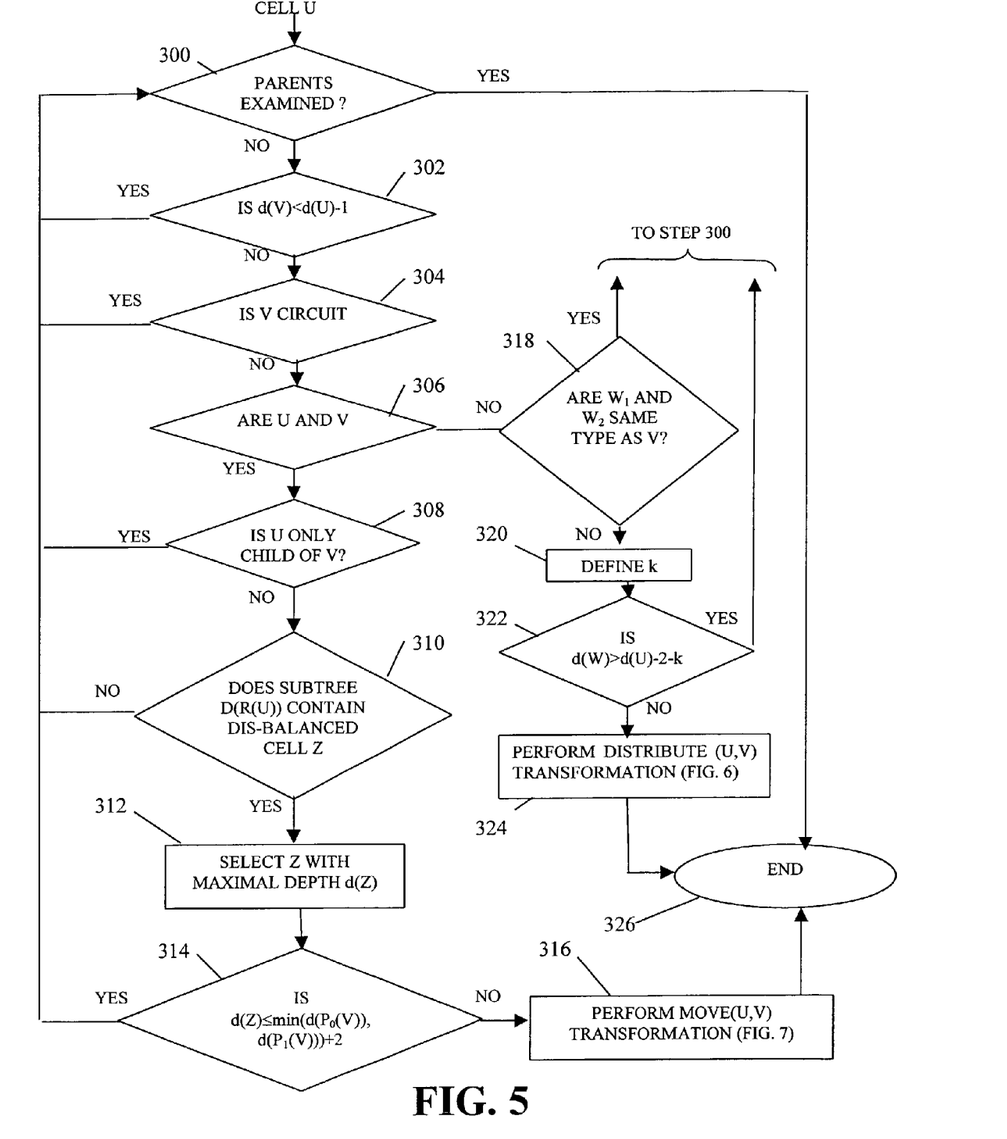

FIG. 5 is a flowchart of the PROCESS TRANSFORMATION procedure used at step 106 (FIG. 3). The process begins at step 300 with the examination of the parents of cell U. If, at step 300, both parents of cell U have already been examined, the process ends at step 326. Otherwise, the process advances to step 302 to consider parent V of cell U. At step 302, if d(V)<d(U)−1 then the process returns to step 300 to consider the other parent W. At step 304, if parent V is an input to the Boolean circuit, the process returns to step 300 to consider the other parent W. If at step 306, cell U and parent cell V are not the same type, the process loops to step 318. Otherwise, if at step 308 cell U is the only child of parent cell V, the process returns to step 300 to consider the other parent W. If cell U is not the only child of cell V (i.e., parent cell V is a non-regular cell), the process advances to step 310 where the uniform subtree D(R(U)) is searched to find dis-balanced cells Z. If subtree D(R(U)) contains no dis-balanced cells Z, the process returns to step 300 to consider the other parent W. Otherwise the dis-balanced cell Z with maximal possible depth d(Z) is selected at step 312. If at step 314 the depth of cell Z is not greater than the minimum depth of either parent plus 2, namely that $d(Z) \leq \min(d(P_0(V)), d(P_1(V)))+2$, then the process returns to step 300, otherwise the MOVE transformation, more fully described in connection with FIG. 7, is applied to cells U and V at step 316 and the process advances to step 326.

If, at step 306, cells U and V are of different types, the process continues to step 318. At step 318, the other parent cell W of cell U is considered (as opposed to parent cell V). Cells $W_1$ and $W_2$ are the parents of cell V and grandparents to cell U. At step 318, if both cells $W_1$ and $W_2$ are of the same type as the type of the cell V then the process returns to step 300. Otherwise, at step 320 parameter k is defined. More particularly, k is 0 if cells W, U, $W_1$, $W_2$ are of the same type. Otherwise, k=1. At step 322, if d(W)>d(U)−2−k, then the process returns to step 300. Otherwise at step 324 the DISTRIBUTE transformation, more fully described in connection with FIG. 6, is applied to cells U and V and the process ends at step 326.

Steps 306 and 308 effectively identify if parent cell V is a non-regular cell. Recall, one form of non-regular cell is one with more than one child or is of a different type than its child. Step 306 identifies if cell V is a non-regular cell because it is a different type from cell U, and the transformation of FIG. 6 is performed (if cell V's parent cell W1 and W2 are not the same type as cell V) to distribute and balance the subtree to make cell V a regular cell. Step 308 identifies if cell V is non-regular cell because it has more than one child, and the MOVE transformation of FIG. 7 is performed to change cell V to a regular cells by creating a new cell V1 to be parent to cell U.

In FIG. 6, cell V is a parent of cell U and cells U and V are of different types, i.e., cell u is an AND2 cell and cell V is an OR2 cell, or vice versa. W is the second parent of cell U, and $W_1$ and $W_2$ are the parents of cell V. At step 400, new cell NEW_V1 is created and connected to cells $W_1$ and W and new cell NEW_V2 is created and connected to cells $W_2$ and W. Both new cells NEW_V1 and NEW_V2 are of the same type as cell U. At step 402, a new cell NEW_U is created connected to cells NEW_V1 and NEW_V2. Cell NEW_U is of the same type as cell V. At step 404, new cell NEW_U replaces cell U so that the children of the cell U become connected to the cell NEW_U instead of to cell U. At step 406, cell V is removed if the cell V had only one child U. At step 408 BALANCE SUBTREE transformation is applied to cells NEW_V1 and NEW_V2.

The DISTRIBUTE transformation increases the number of cells of the Boolean circuit by 2, except where a cell is removed at step 406 in which case the transformation increases the number of cell by 1. The transformation is an equivalent transformation because cell U is replaced with an equivalent cell NEW_U.

FIG. 7 is a flow chart of the MOVE transformation used at step 316 (FIG. 5). Cell V is a parent of cell U and the cells U and V are of the same types. Cell V is a non-regular cell and thus has more than one child. At step 500, a new cell V1 is created as a duplicate of the cell V. At step 502, cell U is connected to the cell V1 instead of to cell V. At step 504, the transformation BALANCE SUBTREE transformation is performed on the subtree D(R(U)). Note that the MOVE transformation increases the number of cells, but the depth of the circuit may actually be reduced b the BALANCE SUBTREE transformation, as previously described.

As previously stated, inputs $x_1, x_2, \ldots, x_n$ have respective arrival depths expressed as non-negative integer numbers $d_1, d_2, \ldots, d_n$. In the present case, the arrival depths do not need to be equal (it is not necessary that $d_1=d_2=\ldots=d_n=0$). Thus, the present invention provides for the more general case of providing an optimally minimal depth Boolean circuit for performing the functions $$f_0(x_1, x_2, \ldots, x_n) = x_1 \vee (x_2 \wedge (x_3 \vee (x_4 \wedge (\ldots)))) \text{ and}$$

$$f_1(x_1, x_2, \ldots, x_n) = x_1 \wedge (x_2 \vee (x_3 \wedge (x_4 \vee (\ldots)))),$$

where the arrival depths of each input $x_1, x_2, \ldots, x_n$ are not the same. It also applies to the special case where $d_1=d_2=\ldots=d_n=0$. Experiments demonstrate that where the input arrival depths are equal and $n \leq 64$, a Boolean circuit obtained by the present invention has a depth no greater than one more, and in some cases the same, as one obtained by prior techniques specifically directed to equal input arrival depths.

In preferred embodiments, the invention is carried out in a computer, with a memory medium, such as a recording disk of a disk drive, having a computer readable program therein containing computer readable program code that carries out the computer processes of the invention. The stating Boolean circuit may be represented in RTL-Verilog code and input as data to the computer. The computer, operating under control of the computer readable program, and particularly the computer readable program code on the disk, executes the code and performs the process steps of the invention, thus supplying an output in the form of an RTL-Verilog code describing the resulting Boolean circuit with minimal depth.

Although the present invention has been described with reference to preferred embodiments, workers skilled in the art will recognize that changes may be made in form and detail without departing from the spirit and scope of the invention.

What is claimed is:

1. A process comprising steps of:
   a) calculating the depth of an existing circuit composed of cells arranged in a tree to perform a Boolean function;
   b) balancing subtrees whose root is a cell selected from the group consisting of cells with a number of children other than one and cells with one child of a type different from the root;
   c) transforming cells of the tree with parent and/or grandparent cells to reduce the depth of the circuit, comprising
      c1) identifying if a parent cell to a selected cell is one selected from the group consisting of cells with two or more children and cells of a type different from that of the selected cell, and
      c2) adjusting the subtree so that each parent cell is the same type as its child and no parent has more than one child; and
   d) outputting a resulting design of the circuit.

2. The process of claim 1, wherein step b) include steps of:
   b1) identifying a number of nets that are leaves of the root;
   b2) if the number of nets that are leaves to the root is equal to 2, constructing a new subtree connected to the nets,
   b3) if the number of nets that are leaves to the root is greater than 2,
      i) selecting two leaves that are nets with minimal depth,
      ii) creating a cell connected to the selected leaves, and
      iii) constructing a new subtree connected to the selected leaves.

3. The process of claim 1, wherein step c2) comprises steps of:
   c3) if the selected cell and its parent cell are different types, balancing the subtree to make the parent cell the same type as the selected cell, or
   c4) if the parent cell of the selected cell has more than one child cell, creating a new cell as parent to the selected cell.

4. The process of claim 3, wherein step c3) comprises steps of:
   i) creating new parent cells of the same type as the selected cell, and a new selected cell of the same type as the original parent cell,
   ii) connecting each new parent cell to the other parent cell and to a respective grandparent cell of the original parent cell,
   iii) connecting the new selected cell to the new parent cells, and
   iv) balancing subtrees containing the new parent cells.

5. The process of claim 3, wherein step c4) comprises steps of:
   i) creating a new cell as a duplicate of the parent cell, and
   ii) connecting the selected cell to the new cell as a parent.

6. The process of claim 1, including:
   e) iteratively repeating step c) until the depth of the circuit is unchanged between successive iterations.

7. The process of claim 1, wherein the circuit has a plurality of inputs having differing depths.

8. A computer usable medium having a computer readable program embodied therein for addressing data to operate a computer, the computer readable program comprising:

first computer readable program code for causing the computer to calculate the depth of an existing circuit composed of cells arranged in a tree to perform a Boolean function;

second computer readable program code for causing the computer to balance subtrees whose root is a cell selected from the group consisting of cells with a number of children other than one and cells with one child of a type different from the root;

third computer readable program code for causing the computer to transform cells of the tree with parent and/or grandparent cells to reduce the depth of the circuit and comprising computer readable program code for causing the computer to identify if a parent cell to a selected cell is one selected from the group consisting of cells with two or more children and cells of a type different from that of the selected cell, and computer readable program code for causing the computer to adjust the subtree so that each parent cell is the same type as its child and no parent has more than one child; and fourth computer readable program code for causing the computer to output a resulting design of the circuit.

9. The computer usable medium of claim 8, wherein the second computer readable program code includes:

computer readable program code responsive to identification that 2 nets are leaves to the root for causing the computer to constructing a new subtree connected to the nets, computer readable program code responsive to identification that more than 2 nets are leaves to the root for causing the computer to
   i) select two leaves that are nets with minimal depth,
   ii) create a cell connected to the selected leaves, and
   iii) construct a new subtree connected to the selected leaves.

10. The computer usable medium of claim 8, wherein the third computer readable program code includes:

fifth computer readable program code responsive to identification that the selected cell and its parent cell are different types for causing the computer to balance the subtree to make the parent cell the same type as the selected cell, and sixth computer readable program code responsive to identification that the parent cell of the selected cell has more than one child cell for causing the computer to create a new cell as parent to the selected cell, and seventh computer readable program code for causing the computer to execute the fifth and sixth computer readable program codes through successive iterations until the depth of the circuit is unchanged between at least two successive iterations.

11. The computer usable medium of claim 10, wherein the fifth computer readable program code comprises:

computer readable program code for causing the computer to create new parent cells of the same type as the selected cell, and a new selected cell of the same type as the original parent cell, computer readable program code for causing the computer to connect each new parent cell to the other parent cell and to a respective grandparent cell of the original parent cell, computer readable program code for causing the computer to connect the new selected cell to new parent cells, and computer readable program code for causing the computer to balance subtrees containing the new parent cells.

12. The computer usable medium of claim 10, wherein the sixth computer readable program code comprises:
    computer readable program code for causing the computer to create a new cell as a duplicate of the parent cell, and
    computer readable program code for causing the computer to connect the selected cell to the new cell as a parent.

13. A process comprising steps of:
    a) calculating the depth of an existing circuit composed of cells arranged in a tree to perform a Boolean function;
    b) balancing subtrees whose root is a cell selected from the group consisting of cells with a number of children other than one and cells with one child of a type different from the root;
    c) transforming cells of the tree with parent and/or grandparent cells to reduce the depth of the circuit and comprising:
        c1) if the selected cell and its parent cell are different types, balancing the subtree to make the parent cell the same type as the selected cell, or
        c2) if the parent cell of the selected cell has more than one child cell, creating a new cell as a parent to the selected cell; and
    d) outputting a resulting design of the circuit.

14. The process of claim 13, wherein step b) includes steps of:
    b1) identifying a number of nets that are leaves of the root;
    b2) if the number of nets that are leaves to the root is equal to 2, constructing a new subtree connected to the nets,
    b3) if the number of nets that are leaves to the root is greater than 2,
        i) selecting two leaves that are nets with minimal depth,
        ii) creating a cell connected to the selected leaves, and
        iii) constructing a new subtree connected to the selected leaves.

15. The process of claim 13, wherein steps c1) and c2) comprise identifying if a parent cell to a selected cell is one selected from the group consisting of cells with two or more children and cells of a type different from that of the selected cell, and adjusting the subtree so that each parent cell is the same type as its child and no parent has more than one child.

16. The process of claim 13, wherein step c1) comprises steps of:
    i) creating new parent cells of the same type as the selected cell, and a new selected cell of the same type as the original parent cell,
    ii) connecting each new parent cell to the other parent cell and to a respective grandparent cell of the original parent cell,
    iii) connecting the new selected cell to the new parent cells, and
    iv) balancing subtrees containing the new parent cells.

17. The process of claim 13, wherein step c2) comprises steps of:
    i) creating a new cell as a duplicate of the parent cell, and
    ii) connecting the selected cell to the new cell as a parent.

18. A process comprising steps of:
    a) calculating the depth of an existing circuit composed of cells arranged in a tree to perform a Boolean function;
    b) balancing subtrees whose root is a cell selected from the group consisting of cells with a number of children other than one and cells with one child of a type different from the root;
    c) transforming cells of the tree with parent and/or grandparent cells to reduce the depth of the circuit;
    d) iteratively repeating step c) until the depth of the circuit is unchanged between successive iterations; and
    e) outputting a resulting design of the circuit.

19. The process of claim 18, wherein step c) comprises steps of:
    c1) identifying if a parent cell to a selected cell is one selected from the group consisting of cells with two or more children and cells of a type different from that of the selected cell, and
    c2) adjusting the subtree so that each parent cell is the same type as its child and no parent has more than one child.

20. The process of claim 18, wherein step c) comprises steps of:
    c1) if a selected cell and its parent cell are different types, balancing the subtree to make the parent cell the same type as the selected cell, or
    c2) if the parent cell of the selected cell has more than one child cell, creating a new cell as parent to the selected cell.

21. A computer usable medium having a computer readable program embodied therein for addressing data to operate a computer, the computer readable program comprising:
    first computer readable program code for causing the computer to calculate the depth of an existing circuit composed of cells arranged in a tree to perform a Boolean function;
    second computer readable program code for causing the computer to balance subtrees whose root is a cell selected from the group consisting of cells with a number of children other than one and cells with one child of a type different from the root;
    third computer readable program code for causing the computer to transform cells of the tree with parent and/or grandparent cells to reduce the depth of the circuit and comprising:
        fourth computer readable program code responsive to identification that the selected cell and its parent cell are different types for causing the computer to balance the subtree to make the parent cell the same type as the selected cell, and
        fifth computer readable program code responsive to identification that the parent cell of the selected cell has more than one child cell for causing the computer to create a new cell as parent to the selected cell, and
    sixth computer readable program code for causing the computer to execute the fourth and fifth computer readable program codes through successive iterations until the depth of the circuit is unchanged between at least two successive iterations; and
    seventh computer readable program code for causing the computer to output the resulting circuit design.

22. The computer usable medium of claim 21, wherein the fourth computer readable program code comprises:
    computer readable program code for causing the computer to create new parent cells of the same type as the selected cell, and a new selected cell of the same type as the original parent cell, computer readable program code for causing the computer to connect each new parent cell to the other parent cell and to a respective grandparent cell of the original parent cell, computer readable program code for causing the computer to connect the new selected cell to new parent cells, and computer readable program code for causing the computer to balance subtrees containing the new parent cells.

23. The computer usable medium of claim 21, wherein the fifth computer readable program code comprises:

computer readable program code for causing the computer to create a new cell as a duplicate of the parent cell, and computer readable program code for causing the computer to connect the selected cell to the new cell as a parent.

* * * * *